(12) United States Patent
Maccioni et al.

(10) Patent No.: US 11,789,054 B2
(45) Date of Patent: Oct. 17, 2023

(54) CIRCUIT FOR MEASURING A RESISTANCE

(71) Applicant: ams Sensors UK Limited, Cambridge (GB)

(72) Inventors: Alberto Maccioni, AE Eindhoven (NL); Monica Schipani, AE Eindhoven (NL); Giuseppe Pasetti, AE Eindhoven (NL)

(73) Assignee: AMS SENSORS UK LIMITED, Cambridge (GB)

( * ) Notice: Subject to any disclaimer, the term of this patent is extended or adjusted under 35 U.S.C. 154(b) by 616 days.

(21) Appl. No.: 16/977,313

(22) PCT Filed: Mar. 12, 2019

(86) PCT No.: PCT/EP2019/056149
§ 371 (c)(1),
(2) Date: Sep. 1, 2020

(87) PCT Pub. No.: WO2019/185347
PCT Pub. Date: Oct. 3, 2019

(65) Prior Publication Data
US 2021/0011066 A1    Jan. 14, 2021

(30) Foreign Application Priority Data

Mar. 29, 2018  (EP) ..................................... 18165049

(51) Int. Cl.
*G01R 27/14* (2006.01)
*H03K 17/687* (2006.01)
*H03M 3/00* (2006.01)

(52) U.S. Cl.
CPC ......... *G01R 27/14* (2013.01); *H03K 17/6871* (2013.01); *H03M 3/30* (2013.01)

(58) Field of Classification Search
CPC . G01R 27/14; G01R 1/30; G01R 1/44; H03K 17/6871; H03M 3/30

USPC .................................................. 324/705, 691
See application file for complete search history.

(56) References Cited

U.S. PATENT DOCUMENTS 3,978,402 A * 8/1976 Ryder .................... G01R 27/14
                                                          341/118
5,453,682 A   9/1995 Hinrichs et al.
(Continued)

FOREIGN PATENT DOCUMENTS

CN        103492888 A * 1/2014  ........... G01R 31/007
JP        2008-271503    11/2008
(Continued)

OTHER PUBLICATIONS

Vosooghi et al., A 0.7 V Relative Temperature Sensor With a Non-Calibrated +/− 1C 3-omega Relative Inaccuracy, 62 IEEE Trans. Cir. & Sys. 2434 (Oct. 2015) (Year: 2015).*
(Continued)

*Primary Examiner* — Tung X Nguyen
*Assistant Examiner* — Robert P Alejnikov, Jr.
(74) *Attorney, Agent, or Firm* — MH2 TECHNOLOGY LAW GROUP LLP (57) ABSTRACT

A circuit for measuring an unknown resistance of a resistive element comprises a sensor circuit to generate a differential voltage dependent on the resistance of the resistive element and a reference circuit to generate a differential reference voltage and a sigma-delta converter comprising a first stage, wherein a first capacitor is selectively coupled to one of the output terminals of the sensor circuit and a second capacitor is coupled to one of the output terminals of the reference circuit. The circuit generates logarithmically compressed values.

15 Claims, 4 Drawing Sheets

(56) References Cited

U.S. PATENT DOCUMENTS

| | | | |
|---|---|---|---|
| 7,126,509 B2* | 10/2006 | Sit .......................... | H03M 1/58 |
| | | | 341/119 |
| 8,947,101 B2* | 2/2015 | Engl ..................... | G01R 27/14 |
| | | | 324/202 |
| 2019/0346497 A1* | 11/2019 | Poletto .................. | G01R 27/14 |

FOREIGN PATENT DOCUMENTS

| | | |
|---|---|---|
| KR | 10-2001-0045789 A1 | 6/2001 |
| KR | 10-2011-0119571 A1 | 11/2011 |
| KR | 10-2014-0140506 A1 | 12/2014 |
| KR | 10-2016-0040887 A1 | 4/2016 |

OTHER PUBLICATIONS

Barrettino, D. et al.: "CMOS Monolithic Metal-Oxide Gas Sensor Microsystems," IEEE Sensors Journal, vol. 6, No. 2, Apr. 2006, pp. 276-286.

European Patent Office, International Search Report for PCT/EP2019/056149 dated May 31, 2019.

Gardner, J. et al.: "CMOS Interfacing for Integrated Gas Sensors: A Review," IEEE Sensors Journal, vol. 10 (No. 12). pp. 1833-1848.

Graf, M. et al.: "CMOS Hotplate Chemical Microsensors" Springer Verlag; Apr. 2007; Edition Microtechnology and MEMS; ISBN 978-3-540-69561-5.

Pertijs, M. et al.: "IEEE A CMOS Smart Temperature Sensor With a 3σ Inaccuracy of 0.1 C From 55 C to 125 C," IEEE Journal of Solidstate Circuits, vol. 40, No. 12, Dec. 2005.

* cited by examiner

CIRCUIT FOR MEASURING A RESISTANCE

CROSS-REFERENCE TO RELATED APPLICATIONS

The present application is the national stage entry of International Patent Application No. PCT/EP2019/056149, filed on Mar. 12, 2019, which claims benefit of priority of European Patent Application No. 18165049.0 filed on Mar. 29, 2018, all of which are hereby incorporated by reference in their entirety for all purposes.

TECHNICAL FIELD

The present disclosure relates to an electronic circuit. Specifically, the present disclosure relates to an electronic circuit for a temperature compensated measurement of the resistance of a resistive element.

BACKGROUND

The measurement of the unknown resistance of a resistive element is a widely used operation in electronic systems. Flow meters and, in particular, gas sensor measurement systems to measure the concentration of a specific gas or specific gases are often based on the measurement of the resistance of a resistive element. Resistance measurement often employs the determination of a current flow through the pn-junction of a bipolar diode or the emitter-base path of a bipolar transistor. However, the current through the diode depends on temperature.

Conventional circuits for the measurement of a resistance therefore use a temperature sensor on board and compensate the measured value with the value from the temperature sensor. The compensation may be calculated numerically requiring a numerical processor. The conventional approach adds additional complexity to the system for the temperature sensor and the processor.

There is a need for a circuit for a temperature compensated measurement of the unknown resistance of a resistive element that is less complex, has high accuracy and allows a fast measurement.

SUMMARY

According to an embodiment, a circuit for measuring a resistance comprises: a resistive element having a resistance to be measured; a sensor circuit to generate a differential voltage dependent on the resistance of the resistive element, the sensor circuit comprising: a first and a second path each including a diode element and an output terminal, one of the first and second paths including the resistive element; a reference circuit to generate a differential reference voltage, the reference circuit comprising: a first and a second path each including a current source and a diode element, the current sources configured to supply a substantially different current; a first and a second output terminal, the first output terminal configured to selectively supply a voltage from one of the first and second paths of the reference circuit and the second output terminal configured to selectively supply a voltage from the other one of the first and second paths of the reference circuit; a sigma-delta converter circuit comprising a first stage and a downstream connected second stage, the first stage comprising: a first and a second capacitor and an integration element, the first capacitor selectively coupled to one of the output terminals of the sensor circuit and the second capacitor coupled to one of the first and second output terminals of the reference circuit; and the second stage comprising an output terminal configured to provide a bitstream dependent on the resistance to be measured.

By way of explanation, it is well-known that the voltage $V_{BE}$ across the pn-junction of a bipolar diode that may be a transistor of which base and collector are short-circuited is (equation 1):

$$V_{BE} = \frac{KT}{q} \eta \cdot \ln\left(\frac{I_E}{I_S}\right)$$

The voltage $V_{BE}$ depends from the emitter current $I_E$ and is logarithmic so that the dynamic range of the measurement is enlarged by the logarithmic compression. The term KT/q represents the temperature dependency.

If a known voltage is forced across an unknown resistance $R_X$, the resulting current flows through the bipolar transistor of which the base emitter voltage $V_{BE1}$ is (equation 2):

$$V_{BE1} = \frac{KT}{q} \eta \cdot \ln\left(\frac{V/R_X}{I_S}\right)$$

If the same principle is applied to a known reference resistance $R_{REF}$, a second voltage can obtained as follows (equation 3):

$$V_{BE2} = \frac{KT}{q} \eta \cdot \ln\left(\frac{V/R_{REF}}{I_S}\right)$$

The circuit according to an embodiment of this disclosure uses the voltage difference $\Delta V_{BE} = \Delta V_{BE1} - \Delta V_{BE2}$. Also according to an embodiment of this disclosure, the circuit uses the difference $\Delta V_{BE\_REF}$ generated by two currents of known ratio, N=I1/I2 or I1=N*I2, wherein the currents I1, I2 run through two identical transistors (equation 4):

$$V_{BE\_REF} = \frac{KT}{q} \eta \cdot \ln\left(\frac{I_1}{I_2}\right) = \frac{KT}{q} \eta \cdot \ln(N)$$

The ratio between $\Delta V_{BE}/\Delta V_{BE\_REF}$ does not depend from temperature so that the unknown resistance $R_X$ can be obtained as follows (equation 5):

$$X = \frac{\Delta V_{BE}}{\Delta V_{BE\_REF}} = \frac{\ln\left(\frac{R_{REF}}{R_X}\right)}{\ln(N)}$$

resulting in (equation 6):

$$R_X = R_{REF} \cdot e^{-X \cdot \ln(N)}$$

The circuit according to an embodiment of the present disclosure uses a sigma-delta converter such as a sigma-delta analog-to-digital modulator or converter that has a specific input structure to convert the ratio between two voltages such as $\Delta V_{BE}$ and $\Delta V_{BE\_REF}$ to a digital word. In this case only one analog-to-digital (ADC) conversion is required which inherently performs the required division of differential base emitter voltages in the input stage of the sigma-delta converter. As an effect of the present circuit, the temperature dependence is removed from the signal processing as can be gathered from the above equations. The ADC conversion through the sigma-delta converter provides a digital output signal that is directly temperature-compensated. As a result, temperature sensors and the use of their output signals become obsolete. The calculation is fast as a numerical processing of a temperature signal is obsolete. The sigma-delta ADC delivers the value X (equation 5) from which the value $R_X$ of the unknown resistance can be calculated according to equation 6. The voltage differences $\Delta V_{BE}$ and $\Delta V_{BE\_REF}$ as well as the value X are logarithmically compressed so that the dynamic range of the measurement is enlarged.

According to an embodiment, a circuit for measuring an unknown resistance of a resistive element includes a sensor circuit portion, a reference circuit portion and a sigma-delta converter circuit portion.

The sensor circuit portion generates a differential voltage that depends on the unknown resistance of the resistive element, in that the sensor circuit comprises a first and a second path each including a diode element such as the base emitter path of a bipolar transistor. The bipolar transistors should be identical or have at least a known area ratio. The differential voltage at the emitters of the transistors of both paths is the differential voltage $\Delta V_{BE}$ that depends from the unknown resistance of the resistive element.

The reference circuit includes first and second paths that each include a current source, however, of substantially different current driving capability. The current sources may be MOS transistors that generate currents of a ratio of N=I1/I2 or I1=N*I2. This may be obtained by suitably dimensioning the widths of the gates of the transistors at a ratio such as 1:N. In practice, the current sources can be the output paths of a current mirror circuit that has a reference current source in the input path. The substantially different current sources of the reference circuit provide the currents to two base emitter paths of two identical reference transistors. Instead of identical transistors, it is possible to use transistors that have a known area ratio. As a result, a voltage $\Delta V_{BE\_REF}$ at the emitters of the bipolar transistors depends from the known ratio N of the currents.

The differential output voltages $\Delta V_{BE}$ and $\Delta V_{BE\_REF}$ from the sensor circuit and the reference circuit, resp., are supplied to the input stage of a sigma-delta converter. Specifically, the $\Delta V_{BE}$ and $\Delta V_{BE\_REF}$ voltages are applied to corresponding first and second capacitors at the input stage of the sigma-delta converter. The charging and discharging operations during the clockwise operation of the sigma-delta analog-to-digital (ADC) converter performs a division of $\Delta V_{BE}/\Delta V_{BE\_REF}$, as explained in more detail herein below.

The charges on the first and second capacitors of the input stage of the sigma-delta ADC are supplied to an integration capacitor according to the well-known operational concept of a sigma-delta modulator. The second stage of the sigma-delta ADC comprises at least a comparator to generate a digital bitstream from the integration operation. One or more additional stages that each comprise an additional integrator can be included in the sigma-delta ADC. At the output of the sigma-delta ADC, a digital bitstream is generated that is representative of the term $\Delta V_{BE}/\Delta V_{BE\_REF}$ and therefore representative of the resistance $R_X$ of the unknown resistor. The sigma-delta ADC's structure according to an embodiment of the present disclosure allows a direct conversion of the ratio between $\Delta V_{BE}$ and $\Delta V_{BE\_REF}$ which increases the efficiency of the measurement process and reduces the conversion time. An extra temperature sensor is not required. The direct conversion of the voltage ratios leads to an increase in the sample rate. Because only one conversion is performed, the current consumption of the circuit is low what is important for a measurement circuit such as a gas measurement circuit measuring the concentration of a gas. The accuracy is increased when compared to conventional circuits because no extra temperature measurement and its use in a numerical calculation is necessary.

In more detail, the sensor circuit includes two paths each including a p-channel MOS transistor and a feedback loop between the source and the gate of the transistor. The feedback loop includes an amplifier.

The reference circuit, in more detail, includes switches that cross-connect the two current paths so that the input stage of the sigma-delta ADC is driven according to the output of the sigma-delta converter with a polarity that makes the overall feedback stable. Whenever the bitstream changes polarity, the cross-connection between the first and second paths of the reference circuit is switched to the complementary state.

As an alternative to a switchable cross-connect directly included in the first and second paths of the reference circuit, the output signals at the emitters of the bipolar transistors of the first and second paths of the reference circuit can be routed through a cross-connect circuit.

At the input stage of the sigma-delta ADC, in more detail, the first capacitor connected to output terminals of the first and second paths of the sensor circuit comprises respective switches that are controlled by phase shifted control signals so that the switches are enabled alternately. Furthermore, the first and second capacitors of the input stage of the sigma-delta ADC are connected to the integration capacitor by a switch and to a common mode voltage through another switch. These switches are also controlled by the phase shifted control signals so that they are enabled alternately. The sigma-delta ADC includes an integration capacitor connected between the input and the output of an amplifier. The output node of the amplifier is forwarded to a downstream connected second stage of the sigma-delta ADC that includes a comparator to generate the output bitstream. At least one other integration element may also be included in the second stage.

The sigma-delta ADC is configured to operate in fully differential fashion. The sigma-delta ADC comprises another signal branch that includes an identical structure concerning the capacitors and the switches connected upstream the integration element, while the amplifier of the integration element performs the complementary operation for that signal branch.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure. The same elements in different figures of the drawings are denoted by the same reference signs.

Figure 1:
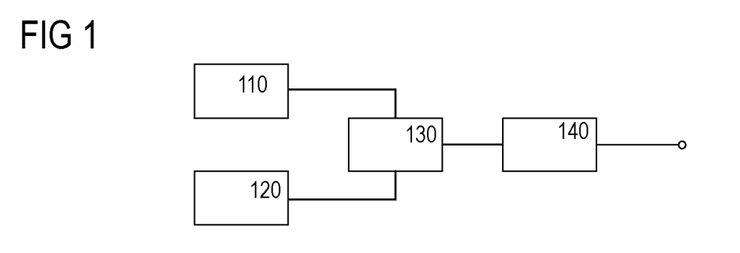
FIG. 1 shows a high level block diagram of the circuit for measuring a resistance.

FIG. 1 shows a top level block diagram of the circuit for measuring a resistance according to the principles of this disclosure. A circuit block 110 includes the resistive element of which the resistance is to be measured. Block 110 is the $\Delta V_{BE}$ sensor. Block 110 generates a voltage difference dependent on a known reference resistor and the unknown resistor to be measured. Block 120 is a $\Delta V_{B\_REF}$ reference circuit that generates a voltage difference dependent on two substantially different currents. The output voltages from blocks 110 and 120 are input to a sigma-delta analog-to-digital (ADC) converter 130 that generates a bitstream that is representative of the division between the voltages from blocks 110, 120. The bitstream from sigma-delta converter 130 is evaluated in a digital machine 140 that generates a digital output value that represents the resistance value of the resistive element to be measured. Digital machine block 140 performs operations such as low pass filtering and converting the bitstream to a digital word that can be further processed by a digital processing circuit. This processing circuit include a processor to calculate the resistance value $R_X$ according to equation 6 from the value X obtained from the sigma-delta ADC.

Figure 2:
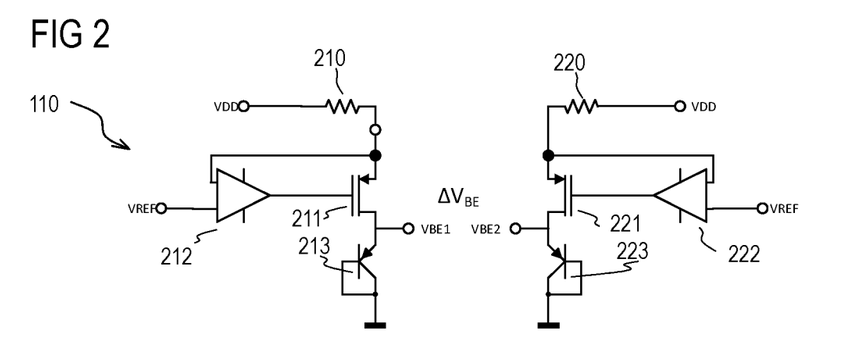
FIG. 2 shows a schematic diagram of a sensor circuit according to an embodiment.

Turning now to FIG. 2, a detailed schematic circuit diagram of block 110 is shown. The $\Delta V_{BE}$ sensor of FIG. 2 includes two circuit paths between voltage VDD and ground potential. The left-hand sided first path includes a resistor 210 of unknown, variable resistance, p-channel MOS transistor 211 and a bipolar transistor 213 of which base and collector terminals are short-circuited. The drain terminal of p-channel MOS transistor 211 is supplied to an amplifier 212 that receives a reference potential VREF and outputs a control signal that controls the gate of the p-channel MOS transistor 211. In a gas concentration sensor, the resistance of resistor 210 may vary in dependence on the gas flow that the resistor is subjected to.

The right-hand sided second path of the $\Delta V_{BE}$ sensor includes a resistor 220 of known, fixed resistance. All the other elements such as p-channel MOS transistor 221, amplifier 222 and bipolar transistor 223 correspond to the elements of the first path. Specifically, transistors 213 and 223 are identical transistors or have known area ratio. The $\Delta V_{BE}$ output voltage is obtained at output terminals connected to the emitter terminals of the transistors 213, 223. The sensor circuit forces a known voltage across the unknown sensor resistor 210 and the reference resistor 220. The currents flowing through said resistors are routed through the bipolar transistors 213, 223. The emitter base voltages are output to the sigma-delta converter 130.

Figure 3:
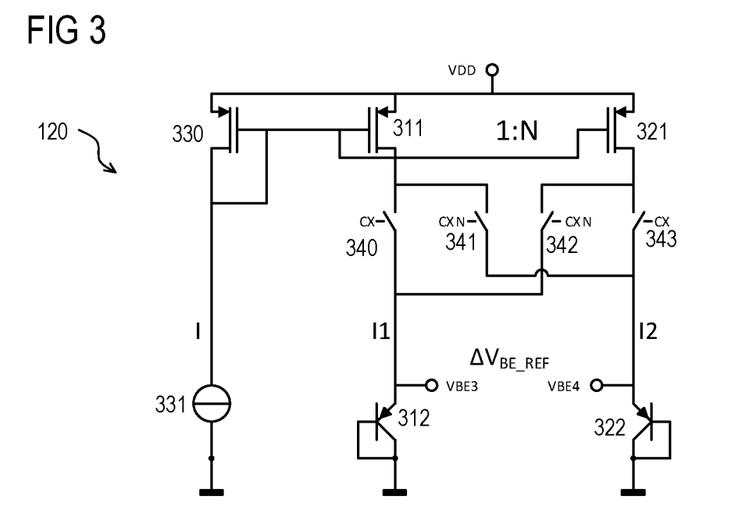
FIG. 3 shows a schematic diagram of a reference circuit according to an embodiment.

Turning now to FIG. 3, a detailed schematic circuit diagram of the $\Delta V_{BE}$ REF reference circuit is shown. The circuit includes a first current path including PMOS transistor 330 and a second current path including PMOS transistor 321 which deliver substantially different currents. Specifically, transistor 311 can be a current source that delivers current and transistor 321 can be a current source that delivers current N*I. The current sources, PMOS transistors 311, 321, are the output path of a current mirror circuit of which the input path includes PMOS transistor 330. The transistor 330 is supplied with a constant current I from constant current source 331. The currents from current sources, PMOS transistors 311, 321, are routed through either one of bipolar transistors 312, 322 of which base and collector terminals are short-circuited. The bipolar transistors 312, 322 are identical or have known area ratio. Switches 340, 341. 342, 343 are provided to route the current either to transistor 322 or to transistor 312 depending on a switch signal CX and the inverted switch signal so that switches 340 and 341 are controlled complementary. In the same way, switches 343 and 342 are controlled complementary. The voltage difference $\Delta V_{BE\_REF}$ can be obtained at the emitter terminals of transistors 312, 322. $\Delta V_{BE\_REF\ V}$ changes polarity in dependence on the control signal CX, CXN. The current sources force a current I or N*I through the identical bipolar transistors 312, 322. The ratio between said currents is either 1:N or N:1 according to the control signals CX, CXN. The emitter base voltages difference $\Delta V_{BE\_REF}$ is output to the sigma-delta converter 130.

Figure 4A:
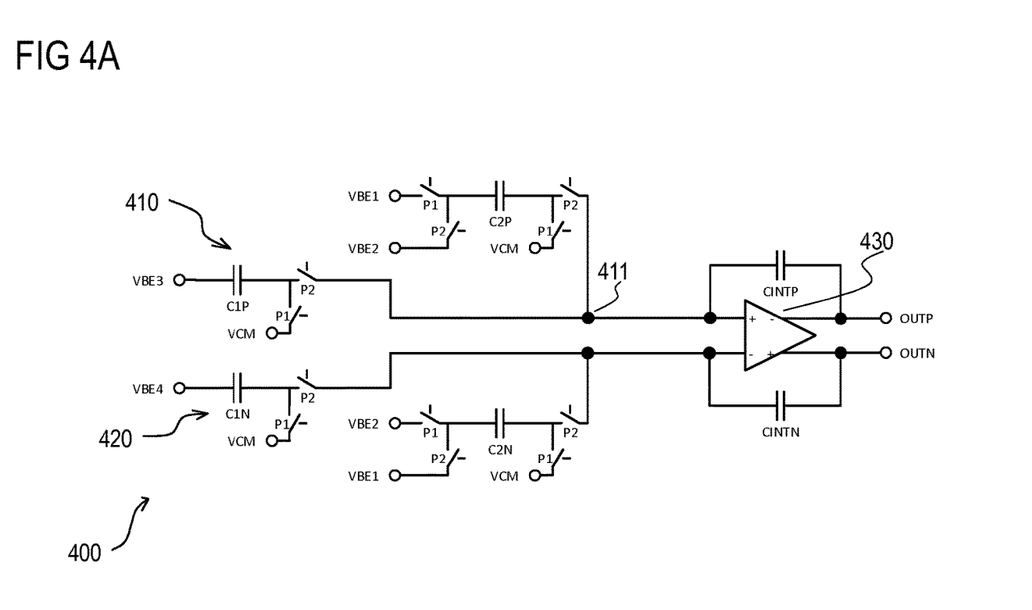
FIGS. 4A and 4B show the first and the second stages of a sigma-delta converter according to the principles of this disclosure.
Figure 4B:
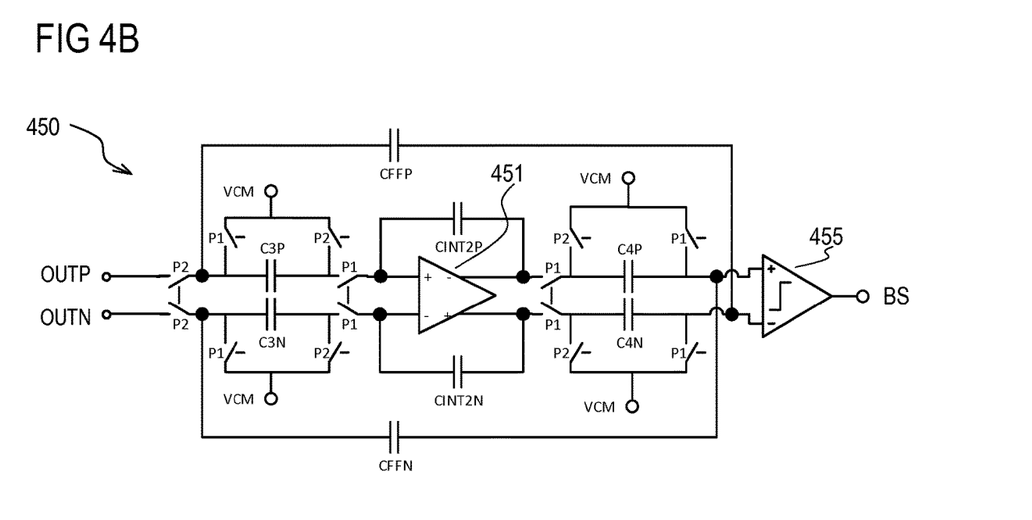

Turning now to FIGS. 4A and 4B, a detailed schematic circuit diagram of a second-order sigma-delta ADC is shown. FIG. 4A depicts the first, input stage 400 of the ADC that is adapted according to the principles of the present disclosure. FIG. 4B depicts the second, output stage 450 of the ADC which is standardized and known to a skilled person. The sigma-delta ADC is configured fully differential, wherein it has a positive and a negative signal branch.

In FIG. 4A, the positive signal branch is shown as the upper portion 410 and the negative signal branch is shown as the lower portion 420. While the elements proximate the input of the ADC are identical in positive and negative branches 410, 420, the differential amplifier 430 operates inversely for the positive and negative branches. In the following, only one of the differential signal branches is explained in more detail. The voltage difference $\Delta V_{BE}$ from the sensor circuit is supplied to the first capacitor C2P. Either one of the voltages VBE1 or VBE2 are supplied to the capacitor C2P through switches that are operated alternately by phase-shifted control signals P1 and P2 (see FIG. 6). The voltage VBE3 from the reference circuit 120 is supplied to the second capacitor C1P. It is to be noted that voltage VBE3 is generated either by the current from current source 311 or from current source 321 depending on the control signal CX, CXN. The capacitors C2P, C1P are connected to a summing node 411 through a respective switch controlled by signal P2. In order to operate the sigma-delta processing, the capacitors C2P, C1P are also connected to a common mode voltage VCM through a switch controlled by signal P1. The summing node 411 is connected to the integration capacitor CINTP which is connected to the positive input and negative output of the integration amplifier 430. At the output of the integration amplifier 430 an output signal OUTP is provided and forwarded to the second stage 450.

As shown in FIG. 4B, the second stage 450 includes another integration amplifier 451 with another integration capacitor CINT2P. Upstream and downstream of the integration amplifier 451 are provided additional capacitors C3P and C4P, respectively, that are connected to the integration amplifier by switches controlled by signal P1. The capacitors can also be connected to the common mode voltage VCM through switches controlled by signals P1, P2. At the output side of the second stage 450 there is provided a differential comparator 455 that compares the positive and negative branches with each other and generates a bitstream BS of "0" and "1" in accordance with the comparison made in comparator 455.

Figure 5A:
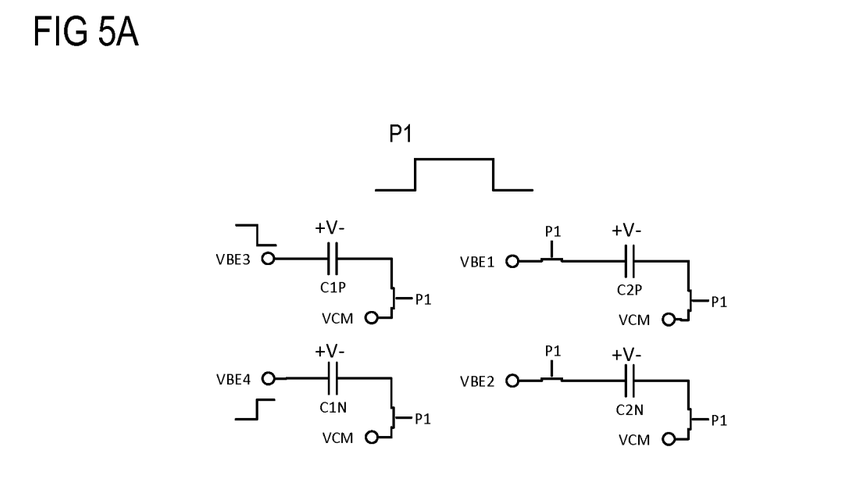
FIGS. 5A and 5B show the switching states of the switches in the first stage of the sigma-delta converter according to a first operational state and a second operational state, respectively.
Figure 5B:
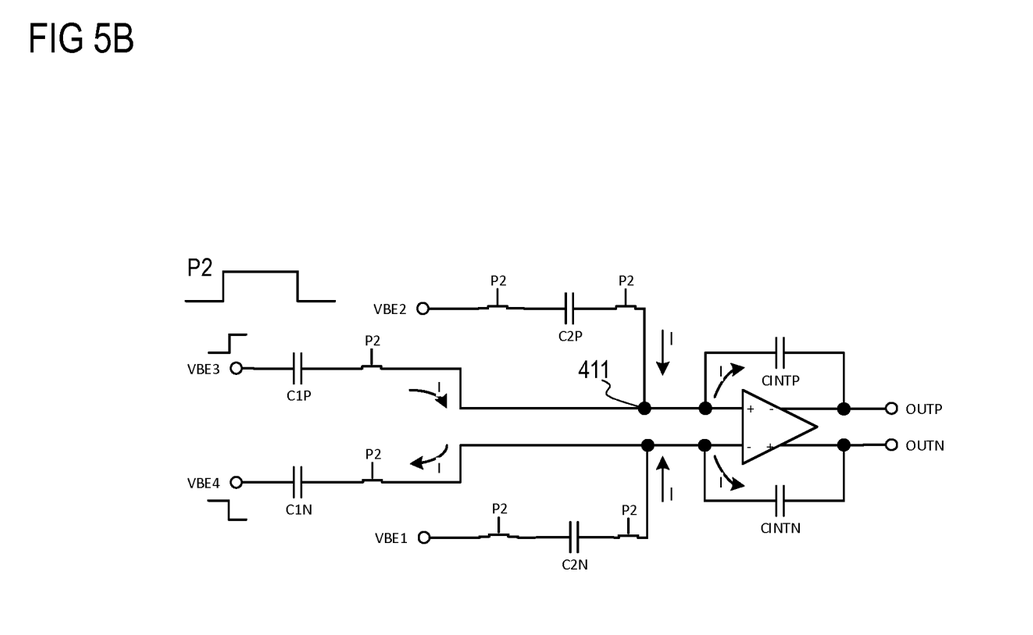

Turning now to FIGS. 5A and 5B, the state of the switches is shown when the control signal P1 is active (FIG. 5A) or the control signal P2 is active (FIG. 5B). The basic principle of operation is based on a charge transfer cycle. The charge transfer cycle is a two-phase process using two alternate, non-overlapping phases P1 and P2. The active phase of signal P2 is phase-shifted with respect to the active phase of signal P1. During phase P1 (FIG. 5A), a voltage is forced across the transfer capacitors C1P and C2P (and C1N, C2N in the negative branch) in that the signal P1 closes the corresponding switches and connects the capacitors C1P, C2P to the common mode voltage VCM and also to voltage VBE1 of the sensor circuit and voltage VBE3 of the reference circuit. During phase P2 (FIG. 5B), the charge is transferred to the integrator which keeps the input voltage constant by adjusting the outputs. The corresponding switches are closed by signal P2 in that capacitors C1P, C2P are connected to summing node 411 connected to the integration capacitor CINTP. The resulting transfer currents I are depicted as arrows in FIG. 5B. At the end of the phase P2 the charge appears across the integration capacitor CINTP for the positive branch and CINTN for the negative branch.

As an example, the charge transferred by capacitor C2P can be calculated as follows:

In Phase P1 its charge is $$Q_1 = C2P(VBE1 - VCM).$$

In Phase P2 the charge is $$Q2 = C2P(VBE2 - VCM),$$

considering that the integrator inputs always go back to VCM after a transient.

The difference in charge can only flow to the integrator capacitor CINTP:

$$\Delta Q = C2P(VBE2 - VBE1)$$

This incremental charge changes the voltage across the capacitor CINTP by:

$$\Delta V = C2P(VBE2 - VBE1)/CINTP$$

As a result, the whole cycle is equivalent to adding $K*(VBE2-VBE1)$ to the integrator output voltage OUTP, wherein K is the capacitor ratio $$K = C2P/CINTP.$$

The same considerations can be done for the negative branch of the differential circuit, and the corresponding output voltage of the integrator OUTN will be changed by $$-K*(VBE2-VBE1).$$

The charge transfer is symmetric with respect to the common mode voltage VCM. The branch connected to VBE3 works in the same way, considering that VBE3 changes its value between phase P1 and P2. The negative branch supplied with VBE4 is symmetric with respect to VBE3 branch and transfers opposite charges to the integrator, as explained before.

Figure 7:
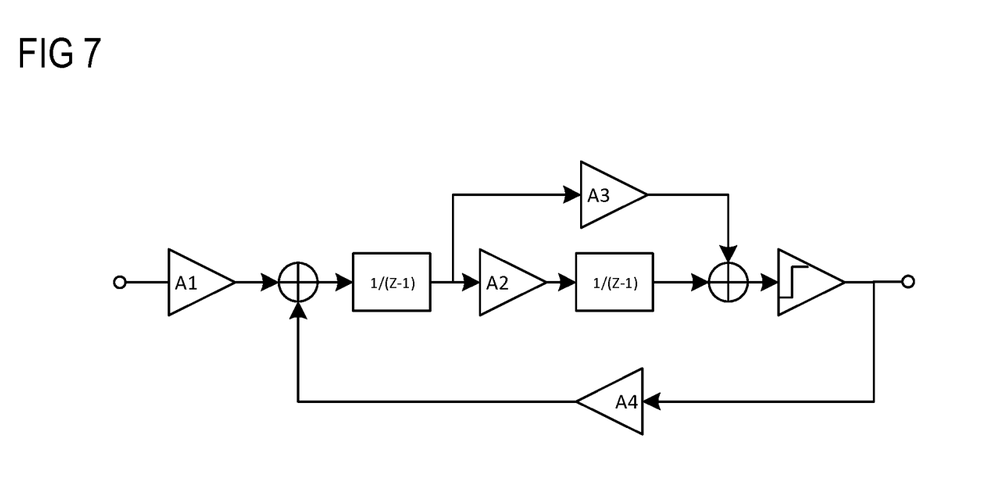
FIG. 7 shows an equivalent functional block diagram of the sigma-delta converter of FIGS. 4A, 4B and 5A, 5B.

Turning now to FIG. 7, considering that every positive and negative branch transfers a charge that depends from $\Delta V_{BE}$ and a capacitor ratio, the operation of the sigma-delta ADC can be modelled with an equivalent circuit, as shown in FIG. 7. The overall transfer function can be modeled using the Z-transform and has a low-pass shape. Instead the quantization noise due to the comparator is present at the output with a high-pass shape. The digital filter applied to the bitstream removes the high-pass noise while decreasing the sample rate and increasing the bit width.

It is to be noted that a sigma-delta ADC is a well understood circuit in digital signal processing, wherein the design of the input stage and its connection to the sensor circuit 110 and the reference circuit 120 is adapted to the principles of the present disclosure.

Figure 6:
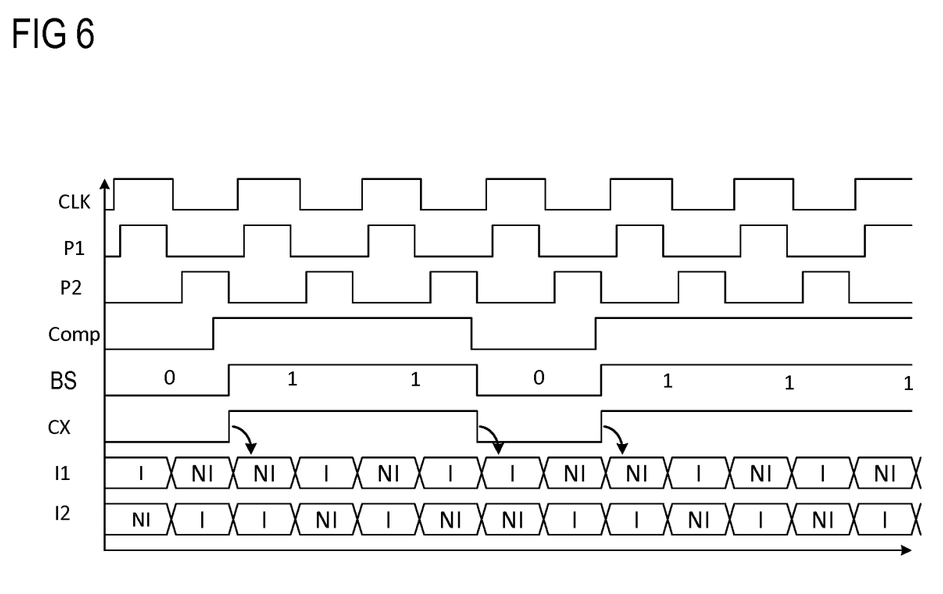
FIG. 6 shows signals that are used to operate the sigma-delta converter as depicted in FIGS. 4A, 4B, 5A and 5B.

FIG. 6 shows signals occurring in the above-described circuits, specifically in the circuits described in FIGS. 4A, 4B and 5A, 5B. The clock signal CLK that triggers the overall function of the device is shown. Therefrom generated are the alternate, non-overlapping phase control signals P1, P2. In dependence on the bitstream BS generated at the output of comparator 455 the control signal CX is generated when the bitstream BS switches from "0" to "1" or "1" to "0". In this case, the switches 340, . . . , 343 are operated to route the current from transistor 311 to one of the transistors 312 or 322 or the current from transistor 321 to the other one of transistors 312, 322. FIG. 6 includes the signal CX, wherein the control signal CXN (not shown in FIG. 6) is the inverse signal of CX.

A dynamic element matching circuit can be included in the reference generation circuit 120 (not shown in FIG. 3) to increase the precision of the current ratio 1:N. Furthermore, the feedback path of signals CX, CXN can also be implemented using fixed currents I1, I2 in the transistors 312, 322 and a cross-connect circuit connected to the terminals VBE3, VBE4 controlled by the bitstream switching signals CX, CXN to select the proper polarity of VBE3 or VBE4.

The present disclosure describes a circuit that directly converts a voltage difference dependent from an unknown resistance of a resistive element to a digital value that can be processed by a downstream connected digital computation circuit. The measurement operates over a wide range as a logarithmic compression is performed. By using a sigma-delta converter having a suitably configured input stage an immediate division between the voltage difference depending from the unknown resistance and a reference voltage difference is performed in a very efficient way. Using the division, the output value is inherently temperature-compensated. The conversion according to the herein disclosed circuits is time and energy efficient compared to conventional solutions while it achieves higher accuracy of the measurement.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

The invention claimed is:

1. A circuit for measuring a resistance, comprising:
   a resistive element having a resistance to be measured;
   a sensor circuit to generate a differential voltage dependent on the resistance of the resistive element, the sensor circuit comprising:
      a first and a second path each including a diode element and an output terminal, one of the first and second paths including the resistive element;
   a reference circuit to generate a differential reference voltage, the reference circuit comprising:
      a first and a second path each including a current source and a diode element the current sources configured to supply a substantially different current;
      a first and a second output terminal the first output terminal configured to selectively supply a voltage from one of the first and second paths of the reference circuit and the second output terminal configured to selectively supply a voltage from the other one of the first and second paths of the reference circuit;
   a sigma-delta converter circuit comprising a first stage and a downstream connected second stage,
   the first stage comprising:
      a first and a second capacitor and an integration element the first capacitor selectively coupled to one of the output terminals of the sensor circuit the second capacitor to one of the first and second output terminals of the reference circuit; and
   the second stage comprising an output terminal configured to provide a bitstream dependent on the resistance to be measured.

2. The circuit according to claim 1, wherein, in the sensor circuit the diodes the first and second paths are identically configured diodes or have known area ratio and wherein the other one of the first and second paths includes a reference resistor.

3. The circuit according to claim 1, wherein, in the sensor circuit, the first and second paths each include a transistor and a feedback loop, wherein the feedback loop is coupled between a source and a gate terminal of the transistor.

4. The circuit according to claim 3, wherein, in the sensor circuit, the diodes are each formed of a pnp-transistor having base and collector terminals connected with each other, the transistors are each formed of a p-channel-MOS-transistor and the feedback loop includes an amplifier.

5. The circuit according to claim 1, wherein, in the reference circuit the current sources of the first and second paths are each formed of an MOS-transistor, the MOS-transistors configured to provide substantially different current.

6. The circuit according to claim 1, wherein, in the reference circuit, the first and second paths are cross-connected with each other by switches, the switches controlled by a signal dependent on a bitstream at the output terminal of the sigma-delta converter, wherein the first and second output terminals are connected to one of the diode elements of the first and second paths.

7. The circuit according to claim 1, wherein, in the reference circuit, the first and second output terminals are cross-connected to the diode elements of the first and second paths.

8. The circuit according to claim 7, wherein, in the reference circuit the MOS-transistors are included in a output path of a current mirror circuit, wherein an input path of the current mirror circuit includes a reference current source.

9. The circuit according to claim 1, wherein, in the sigma-delta converter circuit, the first capacitor is connected to the output terminals of the first and second paths of the sensor circuit through respective switches, the switches comprise control terminals for phase shifted control signals.

10. The circuit according to claim 9, wherein, in the sigma-delta converter circuit, the first and second capacitors are each connected to the integration element through a switch and to a terminal for a common mode voltage through another switch, wherein the switch and the other switch comprise control terminals for the phase shifted control signals.

11. The circuit according to claim 1, wherein, in the sigma-delta converter circuit, the integration element comprises an amplifier which input and output terminals are connected by an integration capacitor.

12. The circuit according to claim 1, wherein the first stage of the sigma-delta converter circuit is of a differential configuration, further comprising: a third and a forth capacitor and another integration element, the third capacitor selectively coupled to one of the output terminals of the sensor circuit and the forth capacitor coupled to the other one of the first and second output terminals of the reference circuit.

13. The circuit according to claim 1, wherein the sigma-delta converter comprises a first branch comprising:
   a first and a second input terminal connected to one of the output terminals of the sensor circuit;
   a first and a second switch through which the first and second input terminals are connected to a terminal of the first capacitor;
   a third switch through which another terminal of the first capacitor is connected to the integration element;
   a forth switch through which a terminal for a reference potential connected to the other terminal of the first capacitor;
   a third input terminal connected to the reference circuit, the third input terminal connected to a terminal of the second capacitor;
   a fifth switch through which another terminal of the second capacitor is connected to the integration element;
   a sixth switch through which the terminal for a reference potential is connected to the other terminal of the second capacitor;
   wherein the first, fourth and sixth switches are controlled by a control signal and the second, third and fifth switches are controlled by a control signal being phase shifted.

14. The circuit according to claim 13, wherein the sigma-delta converter further comprises a second branch identical to the first branch, wherein the third input terminal of the first branch is connected to one of the output terminals of the reference circuit and the third input terminal of the second branch is connected to the other one of the output terminals of the reference circuit.

15. The circuit according to claim 1, wherein the second stage of the sigma-delta converter comprises at least one other integration element and a comparator, the output of the comparator forming the output of the sigma-delta converter configured to provide the bitstream indicative of the resistance of the resistive element.

\* \* \* \* \*

UNITED STATES PATENT AND TRADEMARK OFFICE
CERTIFICATE OF CORRECTION

PATENT NO. : 11,789,054 B2
APPLICATION NO. : 16/977313
DATED : October 17, 2023
INVENTOR(S) : Alberto Maccioni et al.

It is certified that error appears in the above-identified patent and that said Letters Patent is hereby corrected as shown below:

In the Claims

In Claim 1:
At Column 9, Lines 34-35, "integration element the" should be --integration element, the--
At Column 9, Lines 36-37, "circuit the second capacitor to" should be --circuit and the second capacitor coupled to--

In Claim 2:
At Column 9, Line 43, "circuit the diodes the" should be --circuit, the diodes of the--

In Claim 5:
At Column 9, Line 57, "circuit the" should be --circuit, the--

In Claim 8:
At Column 10, Line 6, "circuit the" should be --circuit, the--

In Claim 11:
At Column 10, Line 24, "amplifier which" should be --amplifier of which--

In Claim 13:
At Column 10, Line 44, "potential connected" should be --potential is connected--
At Column 10, Line 54, "capacitor;" should be --capacitor,--

Signed and Sealed this
Twenty-first Day of November, 2023

Katherine Kelly Vidal
*Director of the United States Patent and Trademark Office*